United States Patent [19]
Wittwer

[11] 4,295,176
[45] Oct. 13, 1981

[54] SEMICONDUCTOR INTEGRATED CIRCUIT PROTECTION ARRANGEMENT

[75] Inventor: Norman C. Wittwer, Oldwick, N.J.

[73] Assignee: Bell Telephone Laboratories, Incorporated, Murray Hill, N.J.

[21] Appl. No.: 72,139

[22] Filed: Sep. 4, 1979

[51] Int. Cl.³ .............................................. H02H 9/04
[52] U.S. Cl. ..................................... 361/91; 307/303; 357/41
[58] Field of Search .............. 361/91, 56, 92; 357/41, 357/42; 307/304, 303

[56] References Cited
U.S. PATENT DOCUMENTS

| | | | |
|---|---|---|---|
| 3,407,339 | 10/1968 | Booher | 361/91 |
| 3,676,742 | 7/1972 | Russell et al. | 361/56 |
| 3,819,952 | 6/1974 | Enomoto et al. | 361/56 |
| 4,044,373 | 8/1977 | Nomiya et al. | 361/91 |
| 4,189,739 | 2/1980 | Copeland | 357/41 X |

*Primary Examiner*—J. D. Miller
*Assistant Examiner*—Reinhard J. Eisenzopf
*Attorney, Agent, or Firm*—David I. Caplan

[57] ABSTRACT

An array of semiconductor circuits integrated in a single semiconductor body substrate, each circuit having a separate input terminal, is protected from overvoltages in the inputs by means of a separate diode for each such circuit connected between its protected input node and a reference terminal ($V_{DD}$) in common with all the other circuits. In addition, the high current path of a single auxiliary transistor is arranged to provide, in the presence of overvoltages, a low resistance path between the reference terminal ($V_{DD}$) and the wide area substrate contact $V_{SS}$ in order to protect the input nodes in case of overvoltages when reference terminal ($V_{DD}$) is disconnected ("floating").

8 Claims, 3 Drawing Figures

SEMICONDUCTOR INTEGRATED CIRCUIT PROTECTION ARRANGEMENT

FIELD OF THE INVENTION

This invention relates to the field of semiconductor apparatus, and more particularly to arrangements for the protection of MOS transistor circuits from input overvoltages.

BACKGROUND OF THE INVENTION

In the prior art, various devices have been described for the purpose of protecting a node of a semiconductor circuit when overvoltages are present at a signal input terminal. Such overvoltages are ordinarily caused by uncontrollable electrostatic characters which can be of either positive or negative polarity. Typically, the node to be protected is a gate electrode of an input MOS transistor in a logic circuit. For example, in U.S. Pat. No. 3,819,952 issued to Enomoto et al. on June 25, 1974, various protection devices were described which operate by presenting a very low impedance (short circuit) from the input node to a "substrate ground" ($V_{SS}$) terminal whenever an overvoltage of "one" polarity is present at the signal input terminal. By of "one" polarity is meant substantially of the same polarity as that of a logic "1," which is of negative polarity in P-MOS technology. As used in this context, "ground" means a wide area ohmic electrode contact to the opposed major surface of the body. On the other hand, in the prior art, an overvoltage of the other ("opposite") polarity at the signal input terminal is easily handled by a unidirectional current inhibiting diode connected between the signal input terminal and the bulk of the semiconductor body ("substrate"). Such a diode is conveniently furnished by an elongated semiconductor surface region whose extremities are connected between the signal input terminal and the node to be protected, such a region being of opposite conductivity type from that of the semiconductor bulk.

In many semiconductor integrated circuits, particularly those comprising a multiplicity of logic circuits integrated in the same semiconductor body at a major surface thereof, each such logic circuit has its own individual input node for which protection against overvoltages is required. Although each such node can again easily be protected against overvoltages of the "opposite" polarity by means of a separate diode formed by a separate surface impurity region, and although each such node could be further protected against overvoltages of the "one" polarity by means of a separate protection device which, in response to such overvoltages, provides a high conductivity electrical path from each node to substrate ground, that is, to the wide area electrode contact on the opposite major surface of the body; nevertheless, each such protection device itself would require an undue amount of semiconductor area. Moreover, such a protection arrangement would not protect the nodes against overvoltages of the "one" polarity when the semiconductor body containing the semiconductor circuits itself (including the protection device) is not "plugged in"; i.e., when the terminals $V_{SS}$ and $V_{DD}$ are electrically floating. Thus, protection would not be afforded when the drain $V_{DD}$ terminal is not connected to any external reference voltage source, simply because then the $V_{DD}$ line is floating and can assume any potential, no matter how high. Thus, at times when the terminals of the semiconductor circuits are electrically floating, the input nodes would not be protected against overvoltages of the "one" polarity.

SUMMARY OF THE INVENTION

This invention provides an overvoltage protection arrangement for a multiplicity of MOSFET circuits, typically logic circuits (16, 26, . . . 96), integrated in a single semiconductor body at a first major surface thereof, CHARACTERIZED BY means for connecting a node (16.5, 26.5, . . . 96.5) to be protected of each of said circuits through the high current path of an auxiliary transistor ($T_1$) integrated in said semiconductor body to an electrode in wide area contact with a second opposed major surface of said body, and with a common reference voltage metallization line (101) connected, as by metallization (18, 28, . . . 98), to each said circuit for providing the reference voltage thereto, said means including a separate unidirectional current inhibiting device (17, 27, . . . 97) connected between each said node (16.5, 26.5, . . . 96.5) and the common line (101), the common line being connected through bidirectional current conducting means (102) to the high current path of the auxiliary transistor. By "wide area contact" is meant substantially ohmic contact over a substantial portion of the opposed major surface, each portion typically extending over at least the entire region of that major surface opposed to the MOSFET circuits. Typically, the node (16.5, 26.5, . . . 96.5) to be protected is an input node of the logic circuit. Ordinarily, this input node is a gate electrode of an input MOS transistor of the corresponding logic circuit. The high current path of the auxiliary transistor typically is furnished by the source-drain channel of an auxiliary MOSFET of relatively high $\beta$, that is, high ratio of channel width to channel length, the gate electrode of this auxiliary transistor being connected through one or more biasing diodes to the common reference voltage metallization line 101. During normal operation of the logic circuits to be protected, a terminal ($V_{DD}$) of this reference voltage line is connected to a reference voltage source which, for example, can be the Earth-ground (in which case the wide area contact is connected to a voltage source which is not Earth-ground). Since the unidirectional current inhibiting devices, typically diodes (17, 27, . . . 97), are connected to the common reference voltage line 101, during normal operation these devices do not conduct any current. Thus, the circuit in accordance with this invention cannot limit the (logic) signal input to a value below the desired input level.

Another advantageous feature of the invention is that the gate oxides of all the transistors, both in the protected and protection circuits, can all be of the same thickness. Hence, the gate oxides of all these transistors can be fabricated simultaneously in a single semiconductor body by a single thermal oxide growth step, as known in the art of multiple semiconductor device ("batch") fabrication.

BRIEF DESCRIPTION OF THE DRAWING

This invention together with its features, advantages and objects may be better understood from the following detailed description when read in conjunction with the drawing in which.

Only for the sake of clarity, none of the drawings is to any scale.

DETAILED DESCRIPTION

Figure 3:
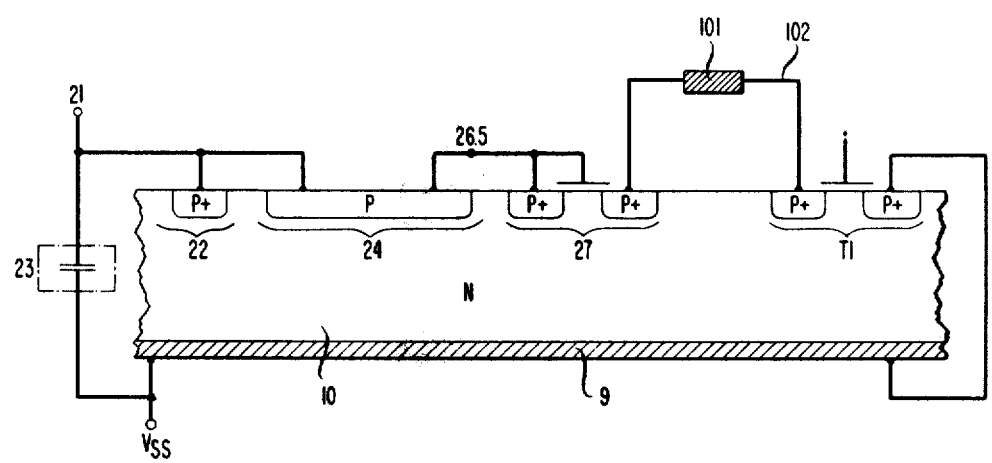

A multiplicity of protected circuits 16, 26, . . . 96 is integrated on a first major surface of a single crystal semiconductor body (not shown), typically silicon, in accordance with conventional P-channel (P-MOS) technology for example. Thus, each circuit is integrated in a neighborhood of the silicon body 10 (FIG. 3) whose bulk conductivity is N-type. Each such circuit has a node 16.5, 26.5, . . . 96.5 typically the gate electrode of an input MOS field effect transistor (MOSFET), to which separate input signals are applied during operation at corresponding signal input terminals 11, 21, . . . 91. These nodes are to be protected from overvoltages on the signals at these input terminals.

Each of the protected circuits is fed its corresponding input signal through a resistor 14, 24, . . . 94 formed typically by a P-type diffused surface region located at the same first major surface of the body as the protected circuits are integrated. Each such resistor is characterized by a resistance in the range of typically about 100 to 2000 ohms. As known in the art, each such resistor thus also forms a separate distributed unidirectional current inhibitor 15, 25, . . . 95 to a wide area ("substrate") contact terminal $V_{SS}$ conventionally formed by an ohmic electrode layer 9 (FIG. 3) in contact with most of the surface area of a second major surface of the body, opposed to the first major surface. During operation, a voltage source of typically about +5 volts is connected to $V_{SS}$. In addition, each input terminal is also optionally connected through a separate unidirectional current inhibiting diode 21, 22, . . . 92 to the bulk of the semiconductor body and hence through the distributed conductivity of this bulk to the wide area contact terminal $V_{SS}$. Typically, each of these diodes 12, 22, . . . 92 is formed by a separate P+ (strongly P-type) surface region located at the first major surface. In addition, each of the input terminals 11, 21, . . . 91 is connected through a separate spark gap device 13, 23, . . . 93 to the terminal $V_{SS}$. Typically, each spark gap device has a gap of about $10\mu$, which thus breaks down and conducts overvoltages in excess of about 300 volts. Each of the protected circuits is separately connected by metallization 18, 28, . . . 98 to a common reference voltage ($V_{DD}$) metallization line 101 terminating in terminal $V_{DD}$ so that during operation each of the protected circuits is supplied with the reference voltage potential applied to the reference terminal $V_{DD}$ typically ground. Thus, this metallization line 101 is ordinarily already readily available for such connection thereto in the neighborhood of every protected circuit. Moreover, each input node 16.5, 26.5, . . . 96.5 is separately connected to the line 101 through a separate unidirectional current inhibiting diode 17, 27, . . . 97. Typically, each such diode is formed by a MOSFET of high $\beta$ of typically about 500 to 1000, whose gate electrode is connected to its drain. In any event, the $\beta$ of each such diode is advantageously sufficiently high that the conductance of each of the diodes 17, 27, . . . 97 in its forward direction is at least an order of magnitude greater than that of the corresponding resistor 14, 24, . . . 94.

At one point of the common metallization line 101, another metallization line 102 connects this line 101 through the source-drain path of an auxiliary MOS field effect transistor $T_1$ to the wide area contact terminal $V_{SS}$. Advantageously, the $\beta$ of $T_1$ is very high, typically about 1000 to 3000. The gate electrode of $T_1$ is connected through an auxiliary diode $D_1$ to the metallization line 102, in order to drop the voltage between the common line 101 and the gate electrode of $T_1$ and thus increase the effective threshold of $T_1$ in the circuit. Alternatively, this threshold increase can be obtained by fabricating $T_1$ with a thicker gate oxide than used in any of the input MOSFETs of the protected circuits; but this ordinarily requires an extra oxide fabrication step. The gate electrode of $T_1$ is also connected through the source-drain path of another MOS field effect transistor $T_2$ to the wide area terminal $V_{SS}$, whereas the gate electrode of $T_2$ is connected to another reference voltage terminal $V_{GG}$ to which a voltage source, typically $-5$ volts, is connected during operation. The diode $D_1$ in combination with the transistor $T_2$ serves to hold the voltage on the gate electrode of the auxiliary transistor $T_1$ below the latter's threshold when the protected circuits are operating normally. The $\beta$ of $D_1$ and $T_2$ are selected to limit the DC leakage current through them to some predetermined value, typically 100 microamperes, during normal operation of the protected circuits. The $\beta$ of $T_2$ is advantageously less than that of $T_1$ by an order of magnitude or more. The transistors $T_1$ and $T_2$ together with the diode $D_1$ form a portion 100 of the protection arrangement.

In order to describe how the protection of this invention is achieved, the first case to be considered is that in which the circuit is not "plugged in"; that is, the case in which the terminals $V_{SS}$, $V_{DD}$ and $V_{GG}$ are electrically floating. In such a case, an overvoltage of positive polarity at any one (or more) of the input terminals, say terminal 21, is shorted through the diodes 22 and 25 to the wide area ("substrate") terminal $V_{SS}$ so that only a relatively small, nondamaging positive voltage appears at any of the protected input nodes including the node 26.5. Moreover, overvoltages of either polarity in excess of about 300 volts, typically, too large thus to be handled by the diodes 22 and 25 are handled by the spark gap device 23. An overvoltage of negative polarity at the input terminal 21 is furnished with a relatively low resistance path through the diode 27 plus the auxiliary transistor $T_1$ to the wide area ("substrate") terminal $V_{SS}$ through the source-drain channel of the auxiliary transistor $T_1$ which is thereby turned "on" by this overvoltage, thus preventing an overvoltage from appearing at the protected node 26.5. Accordingly, the resistance of the resistors 14, 24, . . . 94 should advantageously be much larger, typically by a factor of five or more, than the resistance of the source-drain channel of the transistor $T_1$ in its "on" state and similarly also much larger than the forward resistance of the diodes 22 plus 25. In this way, when the terminals $V_{DD}$ and $V_{GG}$ are floating, overvoltages at the protected nodes relative to the bulk of the semiconductor body are prevented by advantageous voltage divisions between the resistors (14, 24, . . . 94) and the diodes (17, 27, . . . 97) plus the auxiliary transistor $T_1$.

The next case to be considered is that in which the circuits are "plugged in"; that is, the case in which DC voltage sources are conected to the terminals $V_{DD}$, $V_{GG}$ and $V_{SS}$ to permit normal operation of the protected circuits. In such a case, the charge due to an overvoltage of negative polarity on a signal input terminal (11, 21, . . . 91) is shunted through a corresponding diode (17, 27, . . . 97) to the common reference voltage $V_{DD}$ line. Moreover, during normal operation, $V_{GG}$ maintains $T_2$ in its "on" state so that the voltage on the gate electrode of transistor $T_1$ is equal to the voltage at terminal $V_{SS}$ and hence this latter transistor $T_1$ is maintained in its "off" state. Again, for protection of the nodes (16.5, 26.5, . . . 96.5), the resistance of each of the resistors (14, 24, . . . 94) should advantageously be greater than the forward resistance of the corresponding diode (17, 27, . . . 97) (directed from the $V_{DD}$ line 101 towards the protected node). The spark gap device 23 protects against overvoltages in excess of about 300 volts of either polarity while the diodes 25 plus 22 protect against overvoltages of positive polarity, when the terminals $V_{DD}$, $V_{GG}$ and $V_{SS}$ are connected to their corresponding voltage sources. In this manner, protection of the gate oxides as thin as 1000 Angstroms or less of the transistors in the protected circuits can be achieved.

It should be obvious that, during operation with the applied voltage sources $V_{DD}$, $V_{GG}$ and $V_{SS}$ whenever the input signals on the input terminals are confined in the range of $V_{SS}$ to $V_{DD}$, that is, within the appropriate useful range of signals, none of the diodes 12, 22, . . . 92 15, 25, . . . 95 and 17, 27, . . . 97 will conduct any current when the terminals $V_{DD}$, $V_{GG}$ and $V_{SS}$ are connected to their corresponding voltage sources. Only when the input signal on one of the input terminals, say 21, goes above $V_{SS}$ by the threshold of the corresponding diodes 22 and 25 will these diodes conduct and prevent the corresponding node 26.5 from going above $V_{SS}$ plus a threshold, typically $+5+1=6$ volts. Similarly, when, and only when, this input signal goes below $V_{DD}$ by an amount equal to the threshold of the diode 27, then this diode conducts and prevents the node 26.5 from going below about $-1$ volts. Moreover, if this input signal goes below $V_{DD}$ by an amount substantially greater than the threshold of the diode 27, then the voltage division between the resistor 24 and this diodes 27 maintains the voltage at the node 26.5 at a tolerable (nondestructive) level for the gate oxide of the input MOS transistor of the protected circuit 26. Furthermore, if the signal on one of the input terminals thus goes outside the useful range, the input nodes of the protected circuits of the other input terminals are completely unaffected so long as the conductivity of the common line to the voltage source $V_{DD}$ is sufficiently high.

Figure 1:
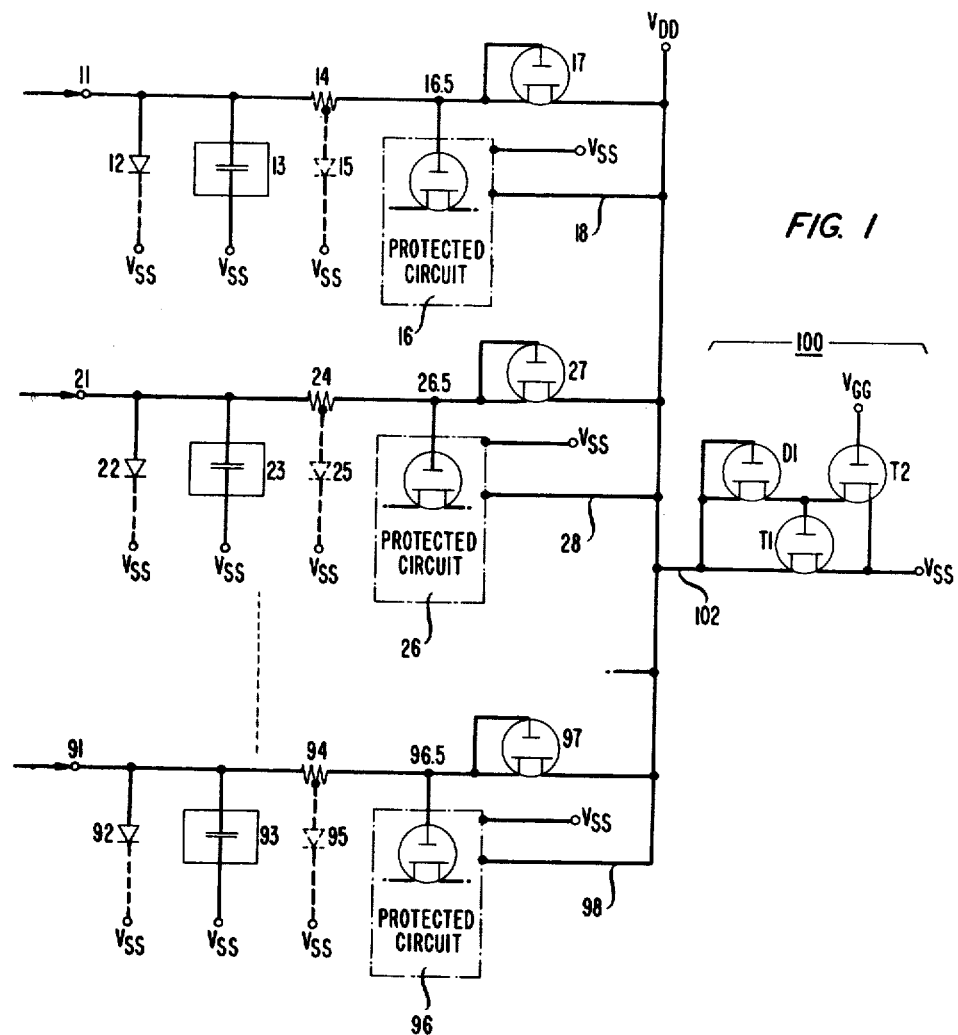
FIG. 1 is a schematic circuit diagram of a semiconductor integrated circuit protection arrangement in accordance with a specific embodiment of the invention.
Figure 2:
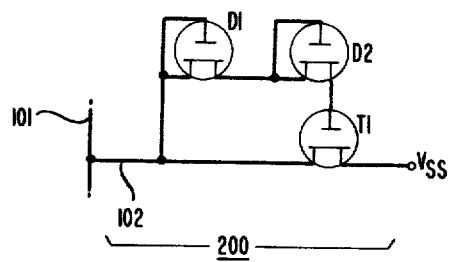
FIG. 2 is a schematic circuit diagram of a portion of a semiconductor integrated circuit protection arrangement in accordance with another specific embodiment of the invention and FIG. 3 is a cross section diagram of a portion of the semiconductor integrated circuit arrangements shown in FIGS. 1 and 2.

The portion 100 can, at some sacrifice of margin of protection, alternately take different configurations such as that of the portion 200 illustrated in FIG. 2; that is, the transistor $T_2$ can be omitted and an extra diode $D_2$ of similar construction as $D_1$ can be added in series with $D_2$, in order to increase further the threshold of $T_1$ so that $T_1$ should not turn "on" unnecessarily during operation. Alternatively further, the portion 100 can have two (or more) diodes mutually in series instead of the one diode $D_1$.

Although the invention has been described in terms of specific embodiments, various modifications can be made without departing from the scope of the invention. For example, instead of connecting the terminal $V_{GG}$ to a voltage source of $-5$ volts, this terminal $V_{GG}$ may be connected to the same voltage source as is the $V_{DD}$ line 101. However, the terminal $V_{GG}$ should not be connected to this $V_{DD}$ line whenever the semiconductor body is not "plugged in"—that is, there should advantageously be no internal (no "on-chip") connection between the gate electrode of the transistor $T_2$ and the $V_{DD}$ line. Moreover, instead of P-MOS technology described above, this invention can obviously be fabricated in N-MOS technology, and hence also in complementary MOS (C-MOS) technology, in conjunction with corresponding modifications in the polarity of the diodes and voltage sources.

I claim:

1. Semiconductor apparatus comprising an overvoltage protection arrangement for a multiplicity of MOSFET circuits (16, 26, . . . 96) integrated in a single semiconductor body at a first major surface thereof, characterized by means for connecting a node (16.5, 26.5, . . . 96.5) of each of said circuits through the high current path of an auxiliary transistor, ($T_1$), integrated in said semiconductor body to an electrode in wide area contact with a second opposed major surface of said body, and with a common reference voltage metalization line (101) connected (18, 28, . . . 98) to each said circuit for providing the reference voltage thereto, said means including a separate unidirectional current inhibiting device (17, 27, . . . 97) connected between each said node (16.5, 26.5, . . . 96.5) and the common line (101), the common line being connected through bidirectional current conducting means (102) to the high current path of the auxiliary transistor.

2. Semiconductor apparatus comprising:
   (a) an array of semiconductor logic circuits integrated in a single semiconductor body at a first major surface thereof, each said logic circuit in the array having a separate input node and each said logic circuit separately connected to a common metallization line for providing a reference voltage to each said circuit;
   (b) a separate first unidirectional current inhibiting device connected between each said input node and the common metallization line;
   (c) an auxiliary transistor ($T_1$) whose high current path is connected between said common line and a wide area contact electrode on a second opposed major surface of the body.

3. Apparatus according to claim 2 in which each said auxiliary transistor is a separate MOSFET, in which each said input node is the gate electrode of a separate input MOSFET, and in which each said input node is separately connected through a separate resistor to a separate input signal terminal.

4. Apparatus according to claim 3 which further includes a second separate unidirectional current inhibiting device connected between said input signal terminal and the bulk of said semiconductor body, each said second inhibiting device directed with respect to said input node in the opposite sense from that of the corresponding said first inhibiting device.

5. Apparatus according to claim 3 in which the conductance of each said first current inhibiting device in its forward direction is at least an order of magnitude greater than the conductance of the resistor connected to the same input node as said current inhibiting device.

6. Apparatus according to claim 2 which further includes a second separate unidirectional current inhibiting device connected between said input signal terminal and the bulk of said semiconductor body, each said second inhibiting device directed with respect to said input node in the opposite sense from that of the corresponding said first inhibiting device.

7. Apparatus according to claim 6 in which each said resistor and each said second unidirectional current inhibiting device connected to the same input signal terminal is provided by an impurity region at said first major surface of opposite conductivity type from that of the bulk of the body in a neighborhood of the logic circuits.

8. Apparatus in accordance with claim 7 in which the conductance of each said first current inhibiting device in its forward direction is at least an order of magnitude greater than the conductance of the resistor connected to the same input node as said current inhibiting device.

* * * * *